United States Patent [19]
Ashoori

[11] Patent Number: 5,640,124
[45] Date of Patent: Jun. 17, 1997

[54] SYSTEM AND METHOD OF ELIMINATING SYSTEMATIC NOISE IN STIMULUS-RESPONSE SYSTEMS

[75] Inventor: Raymond C. Ashoori, Cambridge, Mass.

[73] Assignee: Massachusetts Institute of Technology, Cambridge, Mass.

[21] Appl. No.: 546,497

[22] Filed: Oct. 20, 1995

[51] Int. Cl.$^6$ .............................. H03B 1/04; H04N 5/213
[52] U.S. Cl. .................... 327/551; 327/552; 364/724.01
[58] Field of Search ................................ 327/551, 552, 327/379, 384, 385, 100; 364/724.01, 724.2, 825, 602, 604; 375/285, 296, 346

[56] References Cited

U.S. PATENT DOCUMENTS

| | | | |
|---|---|---|---|
| 3,875,584 | 4/1975 | Fletcher et al. | 348/621 |
| 3,994,284 | 11/1976 | Voelker | 128/693 |
| 4,037,095 | 7/1977 | Howells et al. | 364/835 |
| 4,059,818 | 11/1977 | Kostelnicek | 327/552 |
| 4,604,580 | 8/1986 | Sugiura et al. | 324/311 |
| 4,642,800 | 2/1987 | Umeda | 367/85 |
| 4,841,366 | 6/1989 | Katagiri et al. | 348/620 |
| 4,854,113 | 8/1989 | Strosser et al. | 56/10.2 G |
| 5,140,424 | 8/1992 | Yoshimura et al. | 348/620 |
| 5,343,707 | 9/1994 | Sata | 62/6 |
| 5,400,151 | 3/1995 | Okada . | |

FOREIGN PATENT DOCUMENTS

| | | |
|---|---|---|
| 0257324A2 | 3/1988 | European Pat. Off. |
| 0507470A2 | 10/1992 | European Pat. Off. |

OTHER PUBLICATIONS

Pros. Mesucora, 9-17, May 1961, Paris, France, pp. 336-345, K.E. Drangeid et al., "Oscillographic Recording of Nanosecond Signals".

*Primary Examiner*—Timothy P. Callahan
*Assistant Examiner*—Dinh T. Le
*Attorney, Agent, or Firm*—Samuels, Gauthier, Stevens & Reppert

[57] ABSTRACT

A system and method of eliminating systematic noise in a stimulus-response system. A data acquisition time frame is triggered during which a desired response signal is acquired. The triggering initiates the systematic noise which is stored along with the desired response signal. A stimulus signal is provided to the stimulus-response system in order to induce the desired response signal. A variable delay is introduced between the triggering of the data acquisition time frame and the provision of the stimulus signal. Individual sets of response signals are acquired which respectively correspond to each introduced variable delay. The sets of acquired response signals are shifted so that the stimulus signals are equivalent in time with respect to each set of acquired response signals. The shifted sets of acquired response signals are summed in order to convolute in time the systematic noise.

18 Claims, 4 Drawing Sheets

SYSTEM AND METHOD OF ELIMINATING SYSTEMATIC NOISE IN STIMULUS-RESPONSE SYSTEMS

This invention was made with government support under Grant Number N00013-93-1-0633 awarded by the United States Navy, and Grant Number 9022933-DMR awarded by the National Science Foundation. The government has certain rights in the invention.

BACKGROUND OF THE INVENTION

The invention relates to a system and method of eliminating systematic noise in a stimulus-response system.

Since the development of modern electronics, most processes involving small signal capture have been performed in the frequency domain. This has been the case because it is simple to create analog circuits (e.g. filters, tank circuits, oscillators) which can be tuned to precisely a single frequency. In the example of a lock-in amplifier or an AM radio tuner, all signals except those within only a very narrow bandwidth of a specified frequency are removed, and only those signals in the desired bandwidth are processed further. This filtering procedure greatly reduces the noise in the system by eliminating noise associated with frequencies other than the desired frequency.

A very different approach, with distinct advantages, involves broadband signal capture in the time domain. This method is used in most conventional oscilloscopes. Because signals are observed in the time domain, analysis of signals arising from nonlinear phenomena is far simpler than with frequency domain characteristics. For example, considering the case of an electrical device with a nonlinear current to voltage characteristic, an AC voltage at a particular frequency will generate not only an AC current at the same frequency, but also currents at many harmonics of the fundamental frequency. Precise device analysis then requires characterization of the amplitude and the phase of each harmonic for different values of the AC voltage amplitude applied. This procedure is difficult and is often mathematically intractable. In time domain analysis, one simply observes the current through the device in response to either a sudden voltage step or a voltage pulse. In general, this observation is made with a digital oscilloscope or signal analyzer.

High speed oscilloscopes and other data acquisition schemes are now evolving to the point that they are or will be capable of averaging repetitive signals at a very high rate of speed. There are two basic types of high speed oscilloscopes. One can capture entire waveforms after a single trigger (one-shot oscilloscopes), and the other creates a waveform from a repetitive signal by sampling the signal at varying time intervals after each trigger (sampling oscilloscope).

In general, following a trigger event, the data acquisition system generates some spurious signal which repeats at each trigger. This noise is known as "synchronous" noise because it occurs systematically with each trigger, and it is synchronous to the trigger event. The synchronous noise may arise as a response of the data acquisition to the trigger, as the triggering process itself will create a transient in the system. Additionally, the data acquisition system may generate the noise due to the means used to capture the data. For instance, many systems interleave digital records from several analog to digital converters in order to record data at a high rate of speed. Unavoidably, there is noise generated in switching among the different converters. This "cyclic" noise arises as the system cycles through a sequence of analog to digital converters. Synchronous and cyclic noise may therefore arise in many different data acquisition systems for a wide variety of reasons. The term "systematic noise" is used hereinafter to refer in general to either synchronous noise or cyclic noise.

Breakthroughs in data acquisition technology now allow for measurement of extremely fast signals and also permit unprecedentedly rapid acquisition and signal averaging of repetitive signals. Many commercial single-shot oscilloscopes can average 100 waveforms consisting of 1000 points each in one second. Some data acquisition systems, built for high speed signal averaging, can average around 500,000 waveforms consisting of 1000 points each second. These systems have very little "dead-time" between triggers, and they are capable of rapidly adding waveforms in the form of long arrays of numerical data. This is frequently done with some type of hard-wired array or parallel processing. These high speed signal averaging systems lose only a small fraction of the data to digital signal processing delays. In principle, they can be as efficient as analog systems for signal capture.

Synchronous or cyclic noise is a major roadblock to the use of conventional data acquisition systems for small signal capture. While signal averaging in analog systems allows the capture of minute signals from conditions of large noise, synchronous and cyclic noise have placed severe limits on the usable dynamic range of digital data acquisition systems. Some digital systems allow 12 bit dynamic range, with synchronous noise appearing at the level of the least significant bit. This limits the dynamic range of the system to three orders of magnitude. For an acquisition system with a broadband input, many signals fall below the threshold of observability. The desired signal is buried in a deluge of synchronous noise. This poor dynamic range contrasts with narrow band analog systems which, using appropriate filtering, can extract minuscule signals from very noise backgrounds.

Accordingly, it is an object of the present invention to provide a system and method which accommodates enormous reduction of both synchronous and cyclic noise in systems used for measuring repetitive signals, which are, in general, signals that are the response to a stimulus.

It is a further object of the present invention to provide a system and method which allows for both the extraction of very small signals in conditions of poor signal to noise, and permits retention of high fidelity of signals, despite synchronous noise, for conditions of higher signal to noise ratios.

SUMMARY OF THE INVENTION

The present invention provides a system and method of eliminating systematic noise in a stimulus-response system. A data acquisition time frame is triggered, and during this time frame a desired response signal is acquired. The triggering initiates the systematic noise which is stored along with the desired response signal. A stimulus signal is provided to the stimulus-response system in order to induce the desired response signal. A variable delay is introduced between the triggering of the data acquisition time frame and the provision of the stimulus signal. Individual sets of response signals are acquired which respectively correspond to each introduced variable delay. The sets of acquired response signals are shifted so that the stimulus signals are equivalent in time with respect to each set of acquired response signals. The shifted sets of acquired response signals are summed in order to convolute in time the systematic noise.

DETAILED DESCRIPTION OF THE ILLUSTRATED EMBODIMENTS

Figure 1:
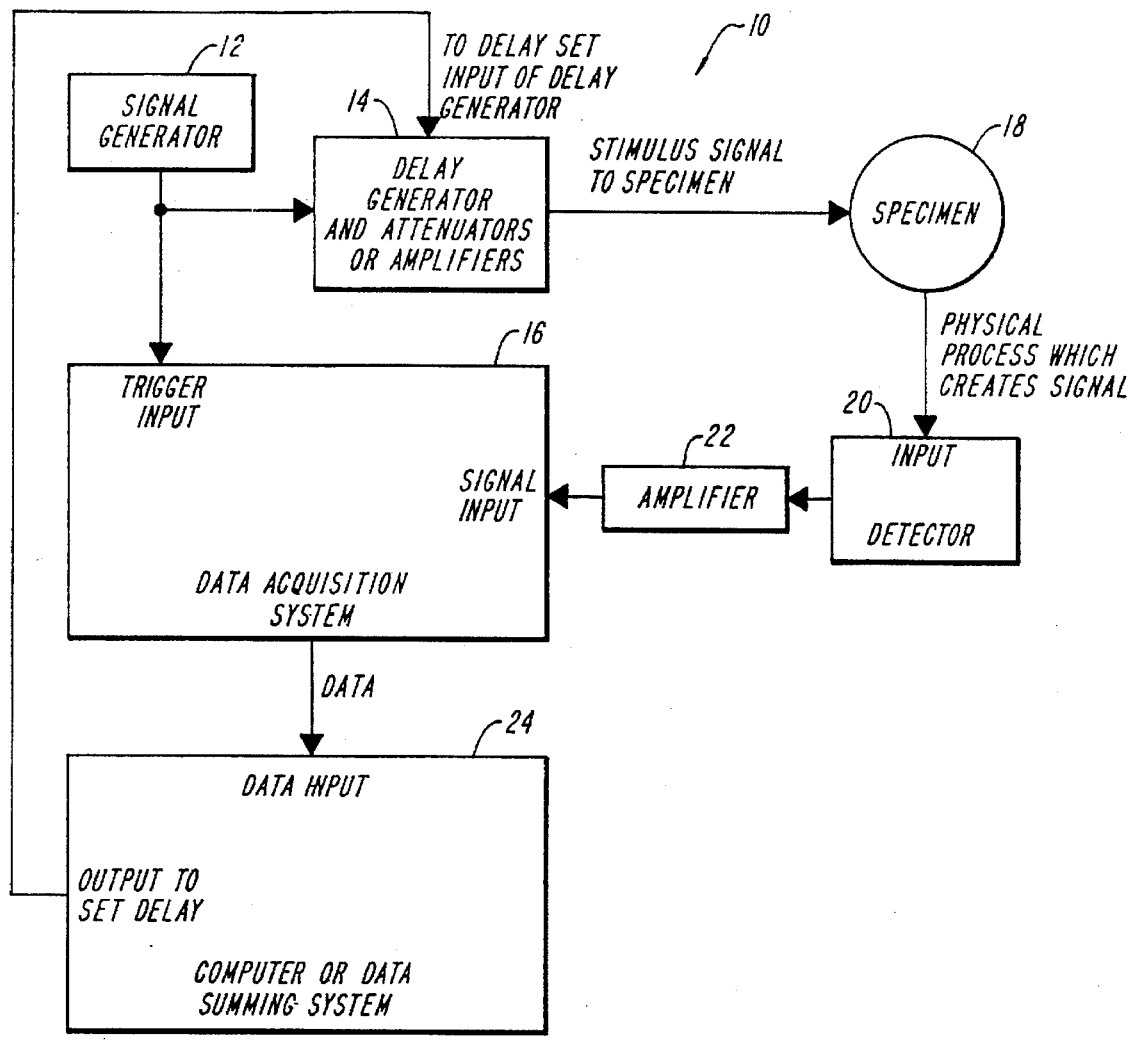
FIG. 1 shows a functional block diagram of an exemplary system for eliminating systematic noise in stimulus-response systems in accordance with the present invention.

A functional block diagram of an exemplary system 10 for eliminating systematic noise in stimulus-response systems in accordance with the present invention is shown in FIG. 1. The system operates to create a variable delay between the triggering of a data acquisition system and the application of a stimulus to a specimen being measured. The specimen may be a wide variety of objects or systems, e.g. a semiconductor, a metal, a biological sample, etc. The response signals for particular delays are then stored and individually shifted in a storage and shift unit to account for the variable delay. The data sets are then added to yield the averaged signal. As the systematic noise then appears at shifted positions with respect to the signal in each of the different data sets, it is averaged away when the data sets are shifted to account for the delay and subsequently added together. This data processing method has been demonstrated to reduce systematic noise levels to below stochastic noise levels, even for very large amounts of signal averaging.

The system 10 includes a signal generator 12 which generates a control signal that is applied to both a delay generator 14 and a data acquisition system 16. The delay generator operates to introduce a stimulus signal to a specimen 18 being applied at a desired delay time from the receipt of the control signal. The control signal also serves as a trigger signal applied to the data acquisition system to start a data acquisition operation.

The stimulus signal applied to the specimen preferably initiates a testing process which results in the generation of a resultant signal. The resultant signal is sensed by a detector 20 and amplified by an amplifier 22. The resultant signal is ultimately applied to a signal input of the data acquisition system 16. The captured resultant signal and accompanying information related to the delay of the stimulus signal is then applied to a computer or data summing system 24. The summing system operates to perform the data processing method of the present invention. An output signal is provided from the computer or summing system to the delay generator 14 for establishing the next occurring delay time period. While the above described system utilizes separate units for signal processing, stimulus signal and delay generation, and shifting and summing of data traces, it will be appreciated by those of skill in the art that other combinations and embodiments of the disclosed units may be utilized to achieve the desired results of systematic noise reduction in a stimulus response system.

Figure 2:
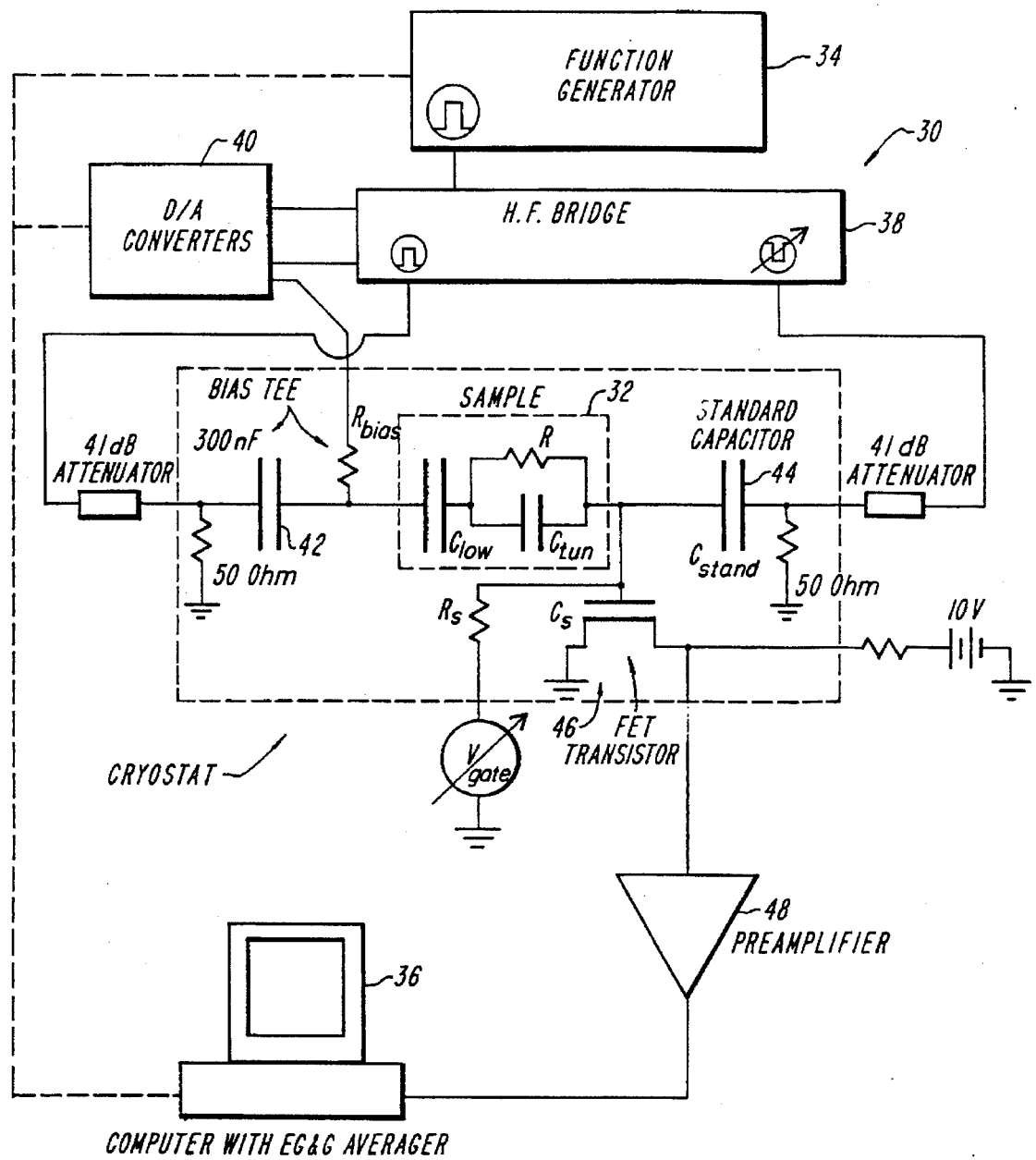
FIG. 2 shows a detailed schematic diagram of a preferable laboratory implementation of a system for eliminating systematic noise in stimulus-response systems in accordance with the present invention.

FIG. 2 shows a detailed schematic diagram of an actual laboratory measurement system incorporating a system 30 for eliminating systematic noise in stimulus-response systems in accordance with the present invention. The measurement system 30 is a specialized measurement system for monitoring capacitive samples 32 which display nonlinear charge relaxation. For this example, it is a capacitance bridge which utilizes the systematic noise reduction technique of the present invention.

A high frequency function generator 34 is used to generate signals for the exemplary system. The function generator creates a trigger pulse on its trigger output channel. This trigger pulse triggers the acquisition of one data trace by the data acquisition system. Data is acquired using a signal averaging card which is contained within a computer 36. After a variable delay time, the function generator also emits a waveform sequence on its signal output channel. Typically, this waveform is a simple square-wave burst, but many other waveforms can been used. This waveform is applied to the input of a high frequency bridge circuit 38. The bridge produces two outputs from this input waveform, one being inverted and the other not inverted. Each of these signals is variably attenuated by means of analog multipliers within the high frequency bridge. The amount of attenuation in each of the two bridge channels is controlled by voltages from D/A converters 40, whose voltages are in turn controlled by the computer.

The two signals, inverted and not inverted, from the bridge are applied to standard capacitors 42 and 44 and the sample 32, respectively. The signals at the junction between the standard capacitor 44 and the sample are then monitored using a sensitive FET amplifier 46. These signals are further amplified by a preamplifier 48, and then recorded by the averaging card located inside the computer 36. The high frequency bridge 38 is used to balance currents from the sample and the standard capacitor so that, at long time scales, there are no signals emanating from the junction between the standard capacitor and the sample. By using the high frequency bridge in this fashion, only signals due to the charge relaxation in the sample are observed. Because the relaxation is due to nonlinear processes, a clear understanding of this process can only be garnered from a time domain method such as the one used here.

The data are summed using the computer and software which incorporate the systematic noise reduction scheme described herein. The computer shifts and directs the function generator to change the delay between the trigger signal and the waveform sequence after the data acquisition system has completed signal acquisition for a particular value of the delay. After stepping through the sequence of delays, the signals are shifted to account for the delays and then summed. The signals observed here are very small, and without the systematic noise reduction scheme, they would be entirely lost within the cyclic noise. Prior to the implementation of the systematic noise reduction scheme, all attempts at such measurements ended in failure.

The processing method of the present invention may be used with an arbitrary stimulus. The stimulus can be a short pulse, a sinewave, a step edge, or any other function of time.

The stimulus can come before or after the trigger in time. The response signals for particular delays may themselves be averaged from many stimulus-response events. Signals from different delays may be individually averaged by different amounts and/or weighted differently in the final sum. This weighting may be useful for eliminating systematic noise under conditions in which it is possible to characterize the systematic noise. The weighting of waveforms from particular delays in the final sum can be random, uniform, or according to a pattern to suit particular needs. The data may be acquired, averages, shifted, and added in any order.

In the exemplary data acquisition system 24 used in accordance with the present invention, data is acquired at fixed time intervals, $\Delta$, following a trigger event. A pulsed stimulus occurs at a variable time, $\tau$ with respect to this trigger signal. First, the signal is averaged at fixed $\tau$ ($\tau=\tau_1$) for some desired number N of signal averages. Thereafter, $\tau$ is adjusted to a new value, $\tau=\tau_1+\Delta$, and N averages are taken with $\tau$ set to this value. This second set of averages is added to the first set; an amount $\Delta$ is subtracted from the time scale of the second set of averages before this addition. Next, $\Delta$ is adjusted to $\tau=\tau_1+2\Delta$, and N averages are taken with $\tau$ set to this value. This third set of averages is added to the sum of the first two sets; an amount $2\Delta$ is subtracted from the time scale of the third set of averages before this addition. This data processing method is continued until the stimulus signal is shifted in total by an amount which is equal to or longer than the periodicity of the cyclic noise (or longer than the time scale of transients in the data acquisition system).

In brief, the exemplary system 10 takes an array of M waveform traces, where M is a multiple of 8 because the illustrated cyclic noise largely has a fundamental period of 8 sample intervals. In such an array, the $i^{th}$ trace is that of a waveform which is the response to a stimulus delayed relative to the data acquisition system's trigger by i sample intervals. The traces are then added, shifting the individual traces back in time by i sample intervals. The resultant sum recovers the original signal completely. The cyclic noise becomes random noise instead of systematic noise, and it is simply averaged away.

The processing method does not blur the signal or limit the observed bandwidth of the acquired waveform. The system removes the cyclic noise without the penalty of reduced bandwidth. This is obviously superior to filtering schemes which reduce signal bandwidth. The method works by filtering away the systematic noise without affecting the desired signal. Additionally, time spent taking shifted data sets is in no way wasted. These data sets are as effective for signal averaging purposes as are unshifted data sets.

Figure 3A:
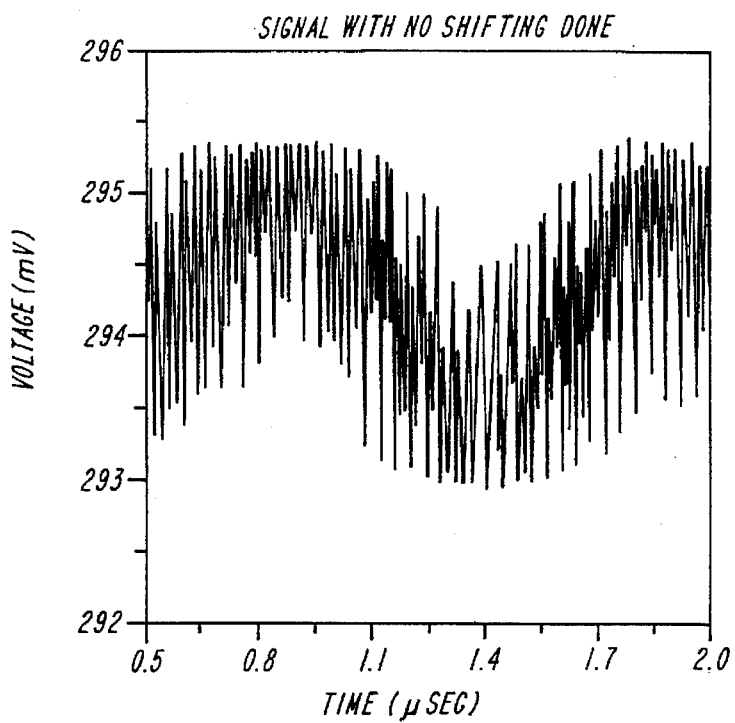
FIGS. 3A and 3B show exemplary results from the application of a 1 MHz signal of amplitude 1 mV to the input of a data acquisition system which effects signal averaging with no shifting delay, and 8 and 32 shifting delays, respectively, with the processing method of the present invention.
Figure 3B:
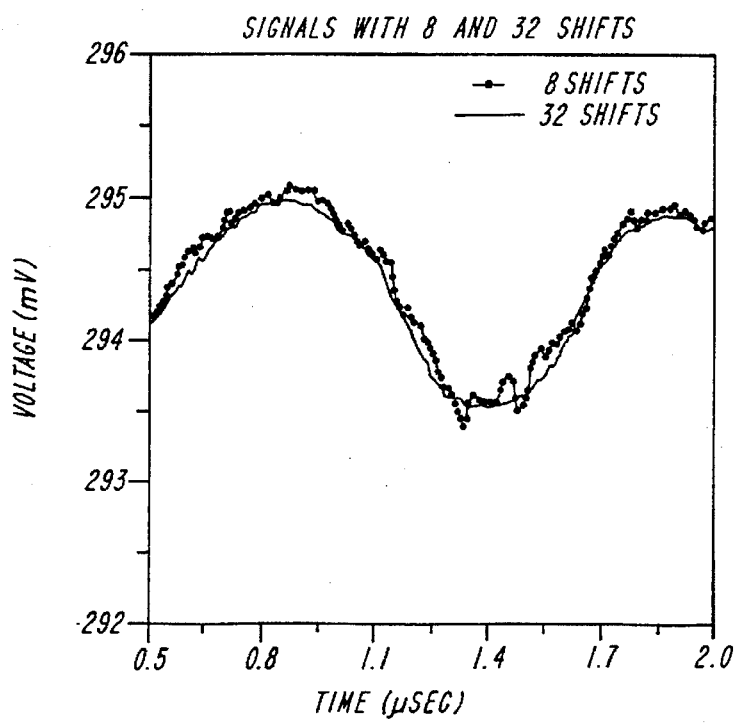

FIGS. 3A and 3B show a resultant signal from signal averaging with no shifting delay, and 8 and 32 shifting delays, respectively. The illustrated waveforms are actual signals from a prototype system such as in FIG. 2. The input signal is simply a 1 MHz sine wave with an amplitude of around 1 mV and a 1 μsec period. The "raw" signal shown in FIG. 3A, with no shifting, is obviously plagued with large amounts of systematic noise. This improves as the shifting scheme is progressively implemented in FIGS. 3B and 3C. It will be appreciated that the signal is not distorted in any way by the shifting delays. There is no phase shift associated with the systematic noise elimination, and the amplitude of the observed signal is also not changed in any way.

Figure 4A:
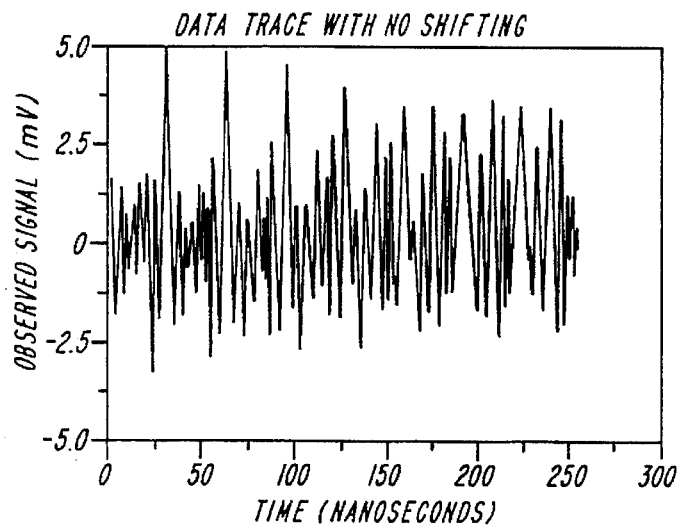
FIG. 4A shows an exemplary data trace of a 167 MHz, 1 mV amplitude sinusoidal signal received in an exemplary data acquisition system with cyclic noise periodic in every 32 sampling intervals.

While the experimental results shown in FIGS. 3A and 3B clearly display marked improvement, the results are even more dramatic when the period of the signal under observation is closer to the sampling time. FIG. 4A displays simulated results for sampling a 1 mV amplitude, 167 MHz, sinusoidal signal every nanosecond. In the waveform shown in FIG. 4A, there is a considerable background of cyclic noise which has a 32 sampling interval periodicity. The results of this simulated measurement, with no shifting correction for the cyclic noise are displayed in FIG. 4A.

Figure 4B:
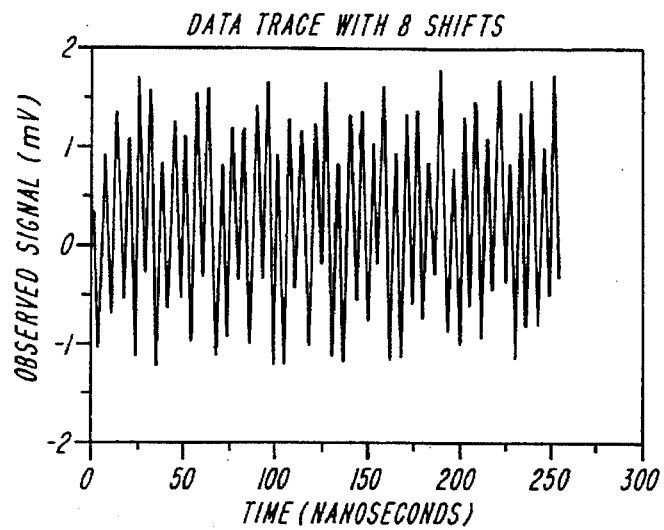
FIG. 4B shows the 167 MHz signal as observed with a data acquisition system which shifts the data 8 times during data acquisition using the processing method of the present invention.
Figure 4C:
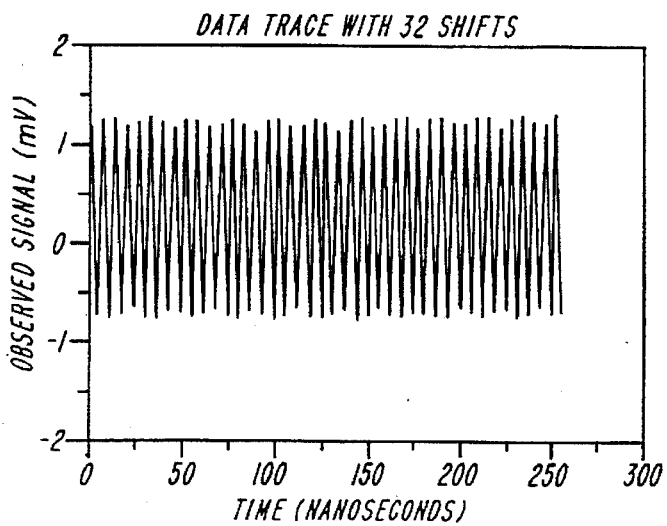
FIG. 4C shows the 167 MHz signal as observed with a data acquisition system which shifts the data 32 times during data acquisition using the processing method of the present invention.

FIGS. 4B and 4C display results from the same input data after the shifting and adding procedure. While the 167 MHz, 1 mV sinusoidal signal was almost undetectable in FIG. 4A, it clearly begins to appear in FIG. 4B after 8 shifts, and it is reproduced with complete fidelity after 32 shifts in FIG. 4C. The vertical scales have been adjusted in FIGS. 4B and 4C to allow the signal to be seen more clearly.

For purposes of illustration, a diagrammatic representation of the waveforms and processing method of the present invention will be described. In the following diagrams, T denotes the triggering of the data acquisition system and D represents a time delay period. The stimulus is applied after the last D on each line. A1, B1, C1 ... represent the first data points taken after the stimulus occurs, while (+) and (−) provide a simplified representation of the systematic noise occurring at that point in the waveform.

The exemplary data traces are initially recorded using the following scheme:

| T | A1(+) | A2(+) | A3(−) |       |       |       |       |
|---|-------|-------|-------|-------|-------|-------|-------|
| T | D(+)  | B1(+) | B2(−) | B3(−) |       |       |       |
| T | D(+)  | D(+)  | C1(−) | C2(−) | C3(+) |       |       |
| T | D(+)  | D(+)  | D(−)  | D1(−) | D2(+) | D3(−) |       |
| T | D(+)  | D(+)  | D(−)  | D(−)  | E1(+) | E2(−) | E3(+) |
| T | D(+)  | D(+)  | D(−)  | D(−)  | D(+)  | F1(−) | F2(+) | F3(+) ... |

The data traces are then displaced relative to one another in computer memory so that the stimulus positions are all equivalent in time. Then the response signals are averaged by adding up the displaced traces. The resultant signals for each time segment after the stimulus, R1, R2, etc., are obtained by summing the elements of each of the columns as shown below. Notice that the systematic noise contributions do not add coherently. Rather, they are scrambled by the shifting process. In this case, the systematic noise averages to zero upon addition of the columns.

|   |      |      |      |      | T    | A1(+) | A2(+) | A3(−) |
|---|------|------|------|------|------|-------|-------|-------|
|   |      |      |      | T    | D(+) | B1(+) | B2(−) | B3(−) |
|   |      |      | T    | D(+) | D(+) | C1(−) | C2(−) | C3(+) |
|   |      | T    | D(+) | D(+) | D(−) | D1(−) | D2(+) | D3(−) |
|   | T    | D(+) | D(+) | D(−) | D(−) | E1(+) | E2(−) | E3(+) |
| T | D(+) | D(+) | D(−) | D(−) | D(+) | F1(−) | F2(+) | F3(+) |
|   |      |      |      |      |      | R1(0) | R2(0) | R3(0) |

The final data averaged trace appears as the individual time elements shown below. These result from summing the elements of the columns in the above diagram.

```
R1 = A1 + B1 + C1 + D1 + E1 + F1
R2 = A2 + B2 + C2 + D2 + E2 + F2
R3 = A3 + B3 + C3 + D3 + E3 + F3
R4 = A4 + B4 + C4 + D4 + E4 + F4
R5 = A5 + ...
R6 = A6 + ...
R7 = A7 + ...
```

Consider now that after each trigger, a sequence of systematic noise is created. The systematic noise always occurs in a given sequence after the trigger, and occurs independently of the stimulus signal. In the example below, a sequence of numbers represents the systematic noise. The data acquisition system records the sum of this systematic noise and the desired data points A1, A2 ... B1, B2, ... from the table above. For this example, it will be appreciated that cyclic noise repeats every seven time segments.

```
TRIG  +3  -1  +2  -2
TRIG  +3  -1  +2  -2   0
TRIG  +3  -1  +2  -2   0  -3
TRIG  +3  -1  +2  -2   0  -3  +1
TRIG  +3  -1  +2  -2   0  -3  +1  +3
TRIG  +3  -1  +2  -2   0  -3  +1  +3  -1
TRIG  +3  -1  +2  -2   0  -3  +1  +3  -1  +2
```

The data traces are then displaced relative to one another in computer memory so that the stimulus positions are all equivalent in time. The response signals are then averaged by adding up the displaced traces. This addition takes place as indicated in the diagram below:

```
                                    TRIG  +3  -1  +2  -2
                              TRIG  +3  -1  +2  -2   0
                        TRIG  +3  -1  +2  -2   0  -3
                  TRIG  +3  -1  +2  -2   0  -3  +1
            TRIG  +3  -1  +2  -2   0  -3  +1  +3
      TRIG  +3  -1  +2  -2   0  -3  +1  +3  -1
TRIG  +3  -1  +2  -2   0  -3  +1  +3  -1  +2
                                    N1  N2  N3  N4
```

After use of the shifting procedure, the resultant cyclic noise in each time segment of the final averaged trace is obtained by adding elements of the columns shown above. In this example, the systematic noise is periodic with a period of seven time segments. Shifting the data traces by a total seven time steps eliminates the cyclic noise from the final averaged signal.

```
N1 = +3 - 1 + 2 - 2 + 0 - 3 + 1 = 0
N2 = -1 + 2 - 2 + 0 - 3 + 1 + 3 = 0
N3 = +2 - 2 + 0 - 3 + 1 + 3 - 1 = 0
N4 = -2 + 0 - 3 + 1 + 3 - 1 + 2 = 0
N5 = ... = 0
N6 = ... = 0
```

Without the use of the data shifting method in accordance with the present invention, the resultant systematic noise in the final trace would have been given by:

```
N1 = +3 + 3 + 3 + 3 + 3 + 3 + 3 = 21
N2 = -1 - 1 - 1 - 1 - 1 - 1 - 1 = -7
N3 = +2 + 2 + 2 + 2 + 2 + 2 + 2 = 14
N4 = -2 - 2 - 2 - 2 - 2 - 2 - 2 = -14
```

For this example, the result of the shifting process yields only the desired signal along with any random noise. All systematic noise from the data acquisition system is removed.

The elements of the time trace which results from signal averaging are T1=R1+N1, T2=R2+N2, T3=R3+N3, ..., etc. For the example using the shifting process described above, the cyclic noise is completely removed and T1=R1, T2=R2, ..., etc.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of eliminating systematic noise in a stimulus-response system, comprising:

triggering a data acquisition device to acquire sets of desired response signals and said systematic noise which is initiated in response to said triggering;

generating stimulus signals to said stimulus-response system in order to induce said sets of desired response signals;

introducing variable delays between the triggering of said data acquisition device and the generation of said stimulus signals;

acquiring individual sets of response signals respectively corresponding to each of said variable delays;

shifting said individual sets of response signals so that the stimulus signals are equivalent in time with respect to each set of said individual sets of response signals; and adding said shifted individual sets of response signals in order to convolute in time said systematic noise.

2. The method of claim 1, wherein said variable delays introduced correspond to the periodicity of said systematic noise.

3. The method of claim 1, wherein each of said individual sets of response signals comprises a predetermined number of response signals with the same variable delay.

4. The method of claim 3 further comprising individually averaging said predetermined number of response signals with the same variable delay.

5. The method of claim 4, wherein the averaging differs between each set of said predetermined number of response signals.

6. The method of claim 3 further comprising introducing varying weighting said predetermined number of response signals with the same variable delay.

7. The method of claim 6, wherein said weighting is random.

8. The method of claim 6, wherein said weighting is uniform.

9. The method of claim 6, wherein said weighting is in accordance with a predetermined weighting pattern.

10. The method of claim 1, wherein said step of providing said stimulus signal precedes said step of triggering.

11. The method of claim 1, wherein said stimulus signal comprises a signal having a function of time.

12. The method of claim 11, wherein said stimulus signal comprises a pulse, step edge or sine wave signal.

13. The method of claim 1, wherein said systematic noise comprises cyclic noise.

14. The method of claim 1, wherein said systematic noise comprises synchronous noise.

15. The method of claim 1, wherein said systematic noise comprises either periodic or random noise.

16. The method of claim 1, wherein said step of adding results only in convoluting said systematic noise and not said desired response signal.

17. A method of eliminating systematic noise in a stimulus-response system, comprising:

triggering a data acquisition device to acquire sets of desired response signals and said systematic noise which is initiated in response to said triggering;

generating stimulus signals to said stimulus-response system in order to induce said sets of desired response signals;

introducing variable delays between the triggering of said data acquisition device and the generation of said stimulus signals;

acquiring individual sets of a predetermined number of response signals respectively corresponding to each of said variable delays;

averaging each of said response signals in each of said individual sets to produce sets of averaged response signals respectively corresponding to each individual set of response signals;

subtracting said variable delays from time scales within each averaged set of response signals; and adding said averaged sets of response signals for each of said delays with preceding sets of averaged response signals for preceding delays so as to convolute in time said systematic noise.

18. An apparatus for eliminating systematic noise in a stimulus-response system, comprising:

means for acquiring signals, means for triggering said acquiring means to acquire a desired response signal and said systematic noise, which is initiated in response to the triggering of said acquiring means;

means coupled to said triggering means for generating a stimulus signal to said stimulus-response system in order to induce said desired response signal, said generating means introducing a variable delay between the triggering of said acquiring means and the generation of said stimulus signal;

processing means operable for storing individual sets of acquired response signals respectively corresponding to each introduced variable delay, shifting said sets of acquired response signals so that the stimulus signals are equivalent in time with respect to each set of acquired response signals, and adding said shifted sets of acquired response signals in order to convolute in time said systematic noise.

* * * * *